United States Patent
Dekker

Patent Number: 5,783,971
Date of Patent: Jul. 21, 1998

[54] LOOP FILTER OF A PHASE-LOCKED LOOP

[75] Inventor: André Dekker, Oulu, Finland

[73] Assignee: Nokia Telecommunications Oy, Espoo, Finland

[21] Appl. No.: 750,059

[22] PCT Filed: Mar. 12, 1996

[86] PCT No.: PCT/FR96/00150
§ 371 Date: Dec. 4, 1996
§ 102(e) Date: Dec. 4, 1996

[87] PCT Pub. No.: WO96/31951
PCT Pub. Date: Oct. 10, 1996

[30] Foreign Application Priority Data

Apr. 4, 1995 [FI] Finland ................. 951604

[51] Int. Cl.$^6$ ................. H03L 7/089; H03L 8/093
[52] U.S. Cl. ................. 331/17; 331/25
[58] Field of Search ................. 331/17, 25

[56] References Cited

U.S. PATENT DOCUMENTS

| | | |
|---|---|---|
| 4,970,472 | 11/1990 | Kennedy et al. ........... 331/8 |
| 5,121,085 | 6/1992 | Brown ........... 331/17 |
| 5,382,923 | 1/1995 | Shimada et al. ........... 331/8 |
| 5,414,741 | 5/1995 | Johnson ........... 331/18 |

FOREIGN PATENT DOCUMENTS

| | | |
|---|---|---|
| 518 684 | 12/1992 | European Pat. Off. . |
| 642 227 | 3/1995 | European Pat. Off. . |

*Primary Examiner*—Siegfried H. Grimm
*Attorney, Agent, or Firm*—IP Group of Pillsbury Madison & Sutro LLP

[57] ABSTRACT

In a phase locked loop, a loop filter is provided between a charge pump and a VCO. The loop filter includes a passive integrator connected to a non-inverting input of an operational amplifier which supplies a tuning voltage to the VCO. The passive integrator functions to short-circuit pulses from the charge pump to ground, to prevent them from appearing at the output of the operational amplifier. The VCO tuning voltage area may be expanded by shifting a DC voltage level at the inverting input of the operational amplifier. Further low-pass filtering may be provided at the output of the operational amplifier.

4 Claims, 3 Drawing Sheets

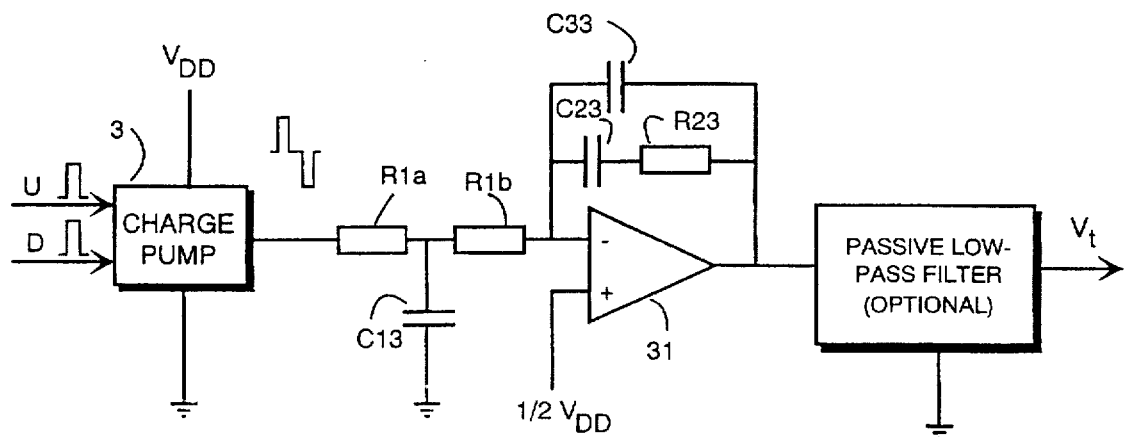
(PRIOR ART)    Fig. 4
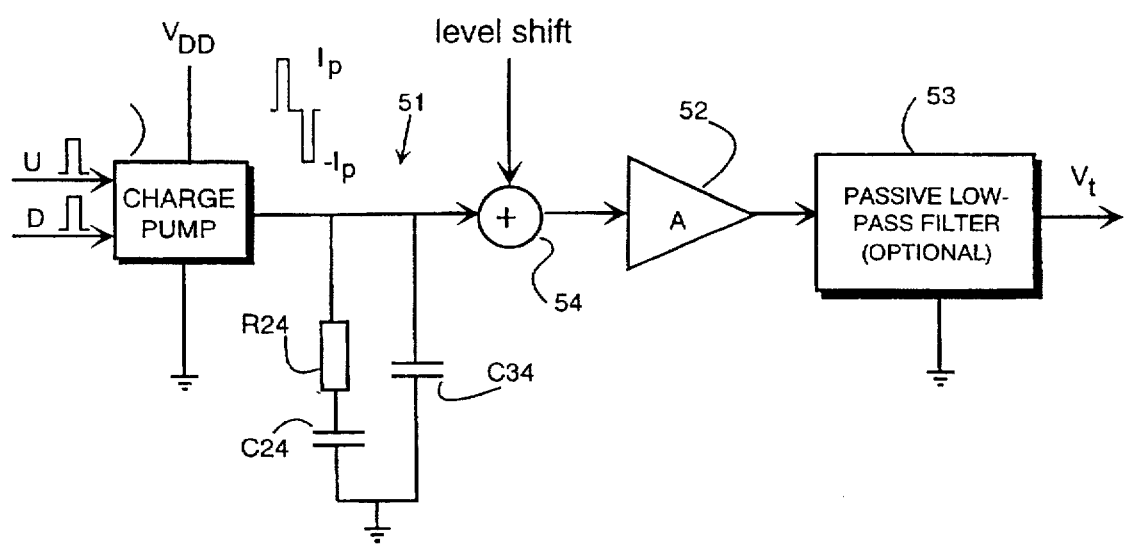
Fig. 5

LOOP FILTER OF A PHASE-LOCKED LOOP

This application is the national phase of international application PCT/ FI96/00150, filed Mar. 12, 1996 which designated the U.S.

The present invention relates to a phase-locked loop and especially to a loop filter used therein.

A phase-locked loop used as a frequency synthesizer contains the parts shown in FIG. 1. Input frequencies are compared in a digital phase/frequency detector 2, one of which frequencies is a reference frequency $f_{ref}$ divided by a factor R in a reference divider 1 and the other is an output frequency $f_{vco}$ which is divided in a loop divider 6 by a factor N. A phase comparator 2 generates U (up) and D (down) pulses, the widths of which are proportional to the frequency and/or phase difference of the input signals. A charge pump 3 converts the U and D pulses into bipolar pulses, the polarity of which indicates the direction of the frequency and/or phase difference and the width of which indicates the magnitude of the difference. The pulses provided by the charge pump are integrated in a loop-filter 4, the direct voltage $V_t$ obtained from which is the control voltage of a voltage-controlled oscillator VCO 5 and it controls the VCO so that the frequency and/or phase difference of the input signals of the phase comparator is minimized.

First generation charge pumps had a voltage output, whereas nowadays most charge pumps of IC circuits containing parts of the PLL circuit have a current output. The first mentioned known charge pumps have a three-state voltage output: the output is connected to the positive supply voltage $V_{DD}$, to the negative supply voltage $V_{ss}$ (which was often ground) or was left open. A bias resistor is used in the filter (integrator) for converting the output voltage into a current excitation for the integrator (filter). When the phase difference of the input signals of the phase comparator is small, the output pulses of the charge pump are narrow and the charge pump is open for most of the time. Therefore, it appears that the integrator is supplied via a resistor much larger than the bias resistor, that is, from a current source. However, the value of the supply current depends on the output voltage of the filter, that is, the VCO tuning voltage $V_t$ and the supply current is symmetrical only if $V_t$ is exactly $V_{DD}/2$, provided of course that Vss=0. Otherwise, it depends on the sign of the phase difference.

A typical passive loop filter is shown in FIG. 2. A filter 21 comprises an integration capacitor C2, a damping resistor R2 and a smoothing capacitor C3. The pulses provided by the charge pump 3 (FIG. 1 and 2) are the output of the filter. Often an additional, passive low-pass filter is used for reducing noise and a reference frequency signal possibly penetrated the filter 21. A resistor R1 is a bias resistor. A disadvantage of the first generation charge pump and the passive filter shown above is that the output current of the charge pump is dependent on the output voltage $V_t$ of the filter.

In order that the input current of the integrator would be independent of its output voltage $V_t$ and the sign of the phase difference, it is known to use instead of a passive filter an active filter (integrator) provided with an operational amplifier as shown in FIG. 3. Ideally, an operational amplifier 31 would keep the voltages on its input ports equal. Therefore, if the voltage affecting in its positive input pole is $V_{DD}/2$, the same voltage would affect in its negative input pole and the current through the bias resistor R1 would be independent of the sign of the phase difference.

A general problem with active filters is that an operational amplifier is slow as such and it is not intended to be supplied by fast pulses generated by digital circuits. In practice, the pulses provided by the charge pump go straight through a capacitor C33 of a feedback path, FIG. 3, to the input of the operational amplifier causing it to overdrive. Also when the loop is in a steady state, the charge pump generates pulses since noise constantly causes some phase difference between the input signals of the phase comparator. In the worst case the pulses would prevent the loop from reaching the steady state and would make it oscillate around the steady state. This may happen because the pulses reach the output of the operational amplifier 31 non-inverted, while the amplifier itself is inverting for low frequencies. Thus the pulses create positive feedback in the loop and so increase phase jitter. Moreover, the operational amplifier needs some time to recover from the overdrive state after the pulses have disappeared. After that, it tries to restore the charge on the capacitor C33. Hence, pulses of some nanoseconds in the input of the amplifier can disturb the operation of the amplifier for microseconds.

In order to solve the above problems caused by using the circuit shown in FIG. 3, it is known to use pre-filtering in front of the amplifier. This is shown in FIG. 4 in which, where appropriate, the same reference numerals are used as in FIG. 3. When the bias resistor of the negative input pole in the operational amplifier 31 is replaced by a series connection of resistors R1a and R1b and a capacitor C13 between the resistors is connected to ground, the voltage Vdd/2 affects now between resistors R1a and R1b. The capacitor C13 will smoothen the pulses of the charge pump 3 so that the operational amplifier is able to follow them. Because the DC input current of the operational amplifier 31 is ideally zero, the voltage affecting over the capacitor C13 is in the steady state the same as in the input poles of the operational amplifier, that is, $V_{DD}/2$.

When using pre-filtering in accordance with FIG. 4, a fairly pure tuning voltage is attained. A disadvantage is, however, that dimensioning involves several compromises and dimensioning is very difficult if the object is a short settling time, low noise and a negligible leak of the reference frequency signal to the tuning voltage. This is caused by restrictions in low-pass filtering and the choice of resistors R1a and R1b. It is also difficult to choose the component values of the known active filter according to FIG. 4: for noise, the active integrator of FIG. 3 can be conceived as a non-inverting amplifier in which gain is 1. In the circuit of FIG. 4 the gain for high frequencies is (R2+R1b)/R1b provided that C3 is not present. Therefore, the presence of the capacitor C13 considerably increases noise and R1b may not therefore be too small. On the other hand, R1a may not be too small because otherwise, the output current of the charge pump would become too great. The output current has a large tolerance which is often different for positive and negative phase errors. All this produces unpredictable effects which cannot be tolerated in mass production. If the capacitor C33 is present, noise will be reduced at high frequencies, but the value of the capacitor C13 should be reduced in order to keep the settling time small. This increases the rate of change in the charge pump pulses in the input of the amplifier, whereby the amplifier may be saturated.

Another disadvantage of the circuit in FIG. 4 is that the output current decreases, that is, the settling time gets longer if the frequency step is large. In that case the active integrator requires a high control current so that the voltage level of the capacitor C13 is forced to change from its steady state value $V_{DD}/2$.

Due to the disadvantages of active filters shown above, that is, their complexity, difficult optimization and the small attenuation of the reference frequency signal, there is still some interest in passive filters. When second generation charge pumps with a constant current output were developed, that is, pumps in which the output current is independent of the output voltage, it was again possible to use a passive filter according to FIG. 2, provided that the tuning voltage need not exceed the range zero operating voltage Vdd. As the current sources of the charge pump are not ideal, the tuning voltage in practice ranges between 1 V, ... ,Vdd-1V. When using pumps like this, the resistor R1 in the circuit of FIG. 2 has the value zero. The phase-locked loop PLL, in which charge pumps with a constant current output are used with the prior art passive integrator, works well when the control voltage area of the oscillator need not be large. There are charge pumps for extending the tuning area, the supply voltage at the output stage of which is even higher than the positive logic supply voltage. However, in a case of a passive filter, there are no means for attaining a higher supply voltage than 6 V. The most usual solution to a person skilled in the art would be to abandon the passive filter and use the known active filter according to FIG. 3 or 4.

This invention discloses a phase-locked loop, the loop filter of which used with a charge pump does not have the disadvantages of the prior art active filters, and which enables a large VCO tuning voltage area.

The invention is characterized by what is stated in claim 1.

The invention is based on the fact that in prior art active filters a passive integrator is connected between the input and output of an inverting operational amplifier, that is, into a feedback path which makes it possible for fast pulses from the charge pump to have direct access to the output of the amplifier. In accordance with the invention, the passive integrator is placed before the non-inverting operational amplifier, whereby it short circuits the pulses of the charge pump to ground and no additional low-pass filter is needed in front of the operational amplifier. Therefore, more low-pass filtering may be included in the passive integrator and when desired, in the filters that can be placed after the operational amplifier, when desired, and the settling time of the loop will nevertheless remain short. Because the operational amplifier is non-inverting, it causes less noise than an inverting amplifier with the same amplification factor. This circuit is less complicated in view of the prior art circuits and it is easier to reach a compromise in dimensioning between the settling time of the loop and the purity of the tuning voltage of the oscillator.

In the following, the invention will be explained in more detail by means of one preferred embodiment according to the invention with reference to the accompanying figures, in which FIG. 1 shows a block diagram of a phase-locked loop, FIG. 2 illustrates a known passive loop filter,

FIG. 3 and

FIG. 4 show known active loop filter circuits,

FIG. 5 shows a block diagram of the loop filter according to the invention, and

Figure 1:
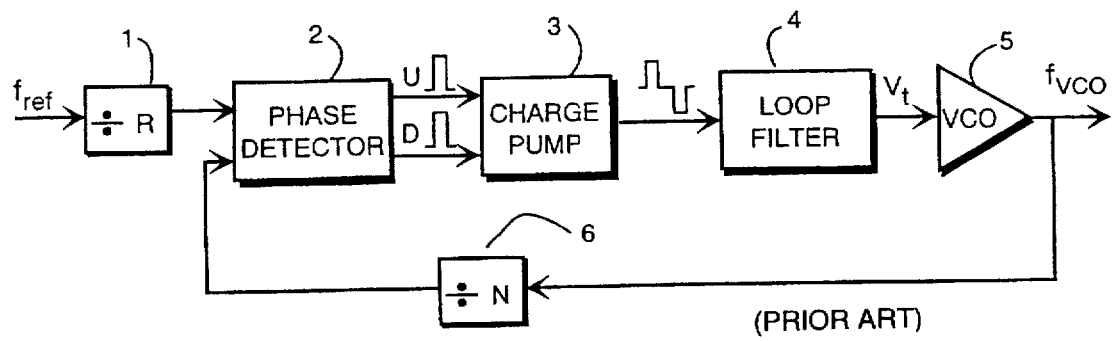
Figure 2:
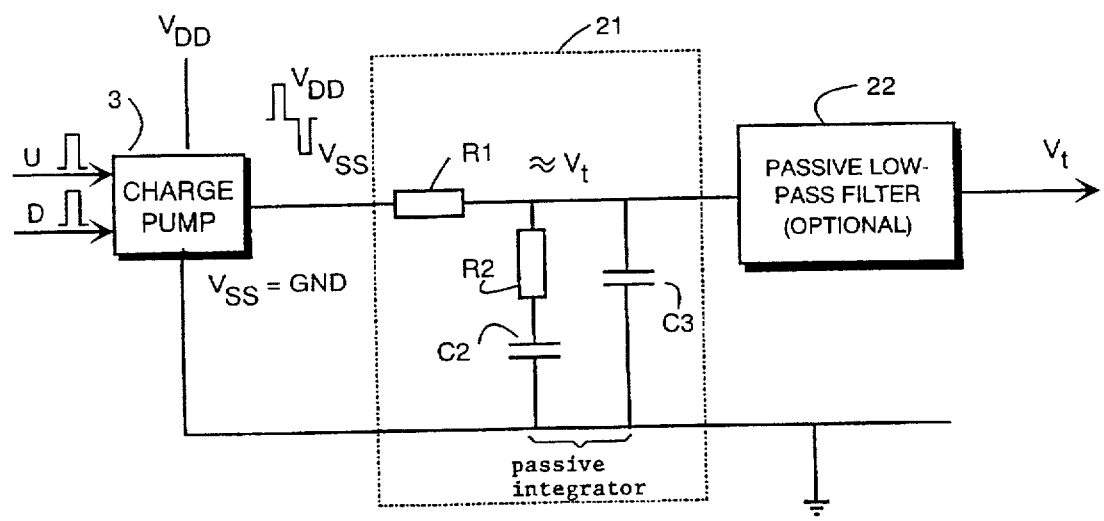
Figure 3:
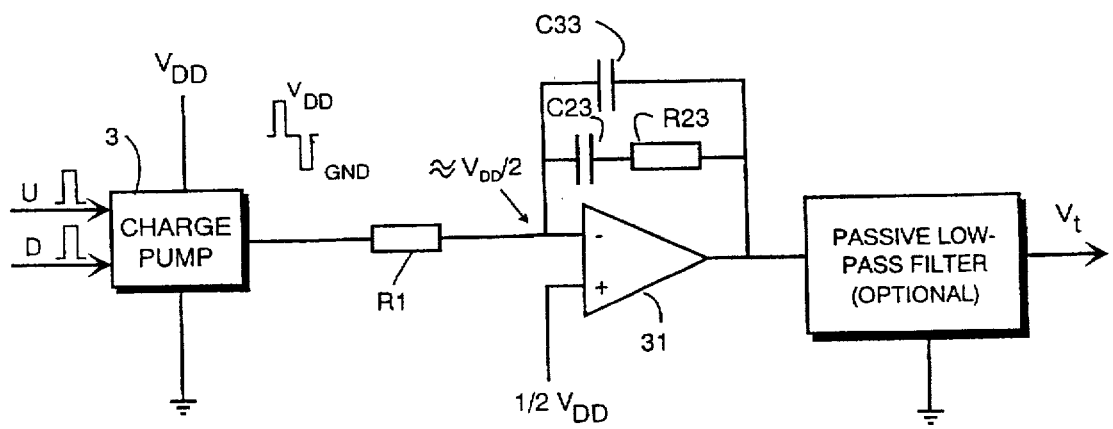

As is shown in FIG. 5, the pulses generated by the charge pump 3 with a constant current output are directed to a known passive integrator 51, e.g. as shown in FIG. 2, and the output voltage provided by it is amplified in a non-inverting operational amplifier 52. It is essential to notice that the passive integrator is used for protecting the operational amplifier 52 against the pulses of the charge pump 3. An additional low-pass filtering is thus not needed. When the passive integrator 51 works as protection, the pulses attenuate better, the number of components is reduced and dimensioning will be simpler in comparison with prior art filters. DC level shifting can also be performed by the amplifier 52 by adding DC voltage $V_O$ to the voltage of either input pole. In this way the desired tuning voltage area is easily attained for the VCO in which area the highest voltage exceeds 6 V. DC level shift is shown in FIG. 5 by an adder 54. A filter 53 can be used, when desired, for filtering the output signal of the amplifier 52.

The dimensioning of the components is done essentially in the same way as for the passive integrator, but it is simpler because the integrator and optional low-pass filter are separated from each other by the amplifier 52.

Figure 6:
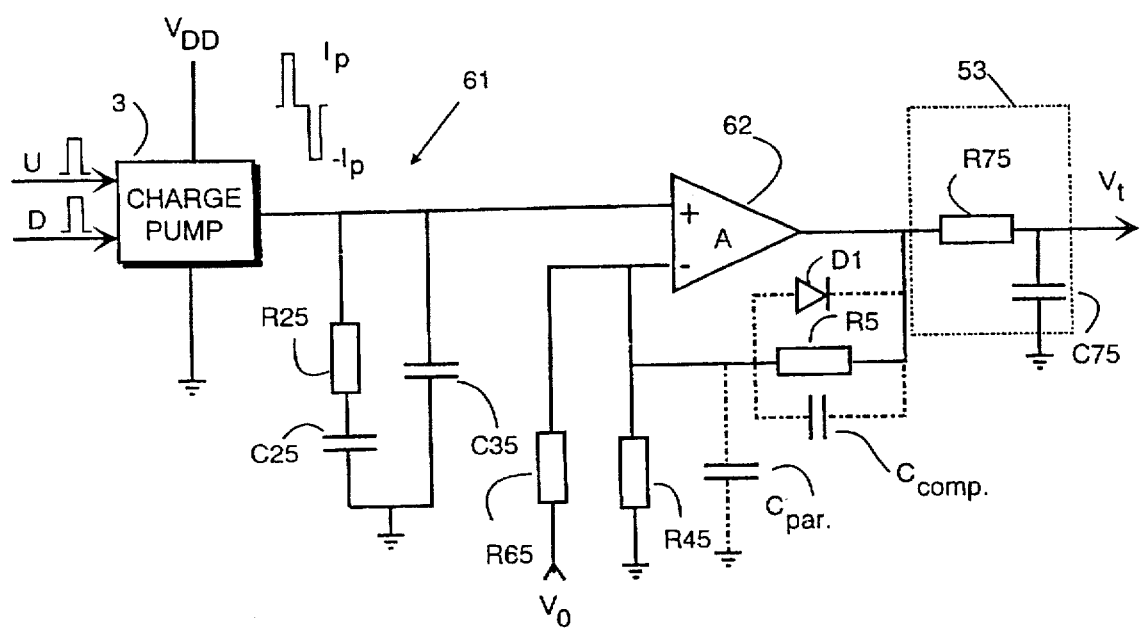
FIG. 6 is one circuit solution of the filter in FIG. 5.

FIG. 6 shows one circuit level solution to the filter of the invention. The direct voltage $V_0$ provided to the inverting input of an amplifier 62 via a bias resistor R65 induces a DC level shift in the output voltage of the amplifier. In practice, the voltage $V_0$ is one of the operating voltages of the equipment, possibly filtered. A capacitance $C_{comp}$ in the feedback path of the amplifier is a small capacitance, the object of which is to compensate the parasitic capacitance $C_{par}$ between the inverting input of the amplifier and ground. Overcompensating turns the amplifier into a kind of low-pass filter. This feature can be used advantageously for attenuating high frequency noise on the output voltage $V_r$, that is, on the VCO tuning voltage. A diode D1 is used for preventing the output of the operational amplifier from going too low in the abnormal case when the charge pump output is zero.

The optionally used low-pass filter 53 may be simply achieved as a RC filter R75, C75.

The circuit in FIG. 5 can be dimensioned in the following way: the gain of amplifier 52 is chosen first. It may be the same as the required VCO tuning voltage area divided by the useful voltage area of the output voltage allowed for the charge pump 3. The gain may not be too large so that noise will not increase. After this, the level shift is computed which is needed to shift the minimum output voltage of the charge pump into a minimum required VCO tuning voltage $V_{rmin}$. The time constants of an integrator 61 are dimensioned in the same way as generally with a passive integrator, but instead of the actual VCO tuning sensitivity, its value multiplied by the gain of the amplifier 62 is used. It is also ensured that the noise effect of the operational amplifier 62 on the tuning voltage $V_r$ is low enough. If it is not, the effect can be reduced by increasing low-pass filtering to the filter 53 and decreasing the capacitor C35, for example.

One advantage of the invention is that the operational amplifier is non-inverting. Some commercially available integrated PLL circuits do not have the possibility to change the polarity of the phase detector, which would be needed if an inverting active filter was used. Thus the filter of the invention can also be used with these IC circuits.

The above explanation and the figures related thereto are only intended to illustrate the present invention. The different variations and modifications of the invention will be obvious to those skilled in the art without deviating from the scope and spirit of the invention disclosed in the appended claims. Therefore it is possible to use the invention in a VCO circuit using a negative tuning voltage.

I claim:

1. A phase-locked loop containing an oscillator controlled by a voltage ($V_r$), a phase detector with a first input for receiving a reference signal and a second input for receiving a oscillator signal ($f_{vco}$) obtained from a voltage-controlled oscillator output, possibly divided in a frequency divider and which in response to the difference of the input signals generates U (up) and D (down) pulses, a charge pump which converts the U and D pulses conducted thereto into bipolar current pulses of the output, the current of which is essentially independent of the output voltage, integration means for converting the pulses provided by the charge pump into the tuning voltage ($V_t$) of the voltage-controlled oscillator, characterized in that the integration means comprise a passive integrator (51) to which the pulses provided by the charge pump are conducted for forming an integrated voltage, and an operational amplifier (52), to the non-inverting input of which said integrated voltage is conducted and the output voltage of which is the tuning voltage ($V_t$) of the voltage-controlled oscillator, whereby the passive integrator (51) protects the operational amplifier (52) against current pulses.

2. A phase-locked loop according to claim 1, characterized in that the integration means also comprises means (54) for shifting the voltage level of the integrated voltage.

3. A phase-locked loop according to claim 2, characterized in that the means (54) for shifting the voltage level of the integrated voltage comprise means ($V_O$, R65) for converting the DC level of the inverted input of the operational amplifier (52).

4. A phase-locked loop according to claim 1, characterized in that the output of the operational amplifier (52) is connected to a low-pass filter for further filtering the output voltage ($V_t$).

\* \* \* \* \*

UNITED STATES PATENT AND TRADEMARK OFFICE
CERTIFICATE OF CORRECTION

PATENT NO. : 5,783,971
DATED : July 21, 1998
INVENTOR(S) : Dekker

It is certified that error appears in the above-identified patent and that said Letters Patent is hereby corrected as shown below:

Title page, Please change "[86] PCT No.: PCT/FR96/00150"

to --[86] PCT No.: PCT/FI96/00150--

Signed and Sealed this

Ninth Day of February, 1999

Attest:

Attesting Officer

*Acting Commissioner of Patents and Trademarks*